United States Patent
Guo et al.

(10) Patent No.: US 11,186,676 B2
(45) Date of Patent: Nov. 30, 2021

(54) POLYMER CONTAINING S,S-DIOXIDE-DIBENZOTHIOPHENE IN BACKBONE CHAIN WITH CONTENT-ADJUSTABLE TRIARYLAMINE END GROUPS AND PREPARATION METHOD AND APPLICATION THEREOF

(71) Applicant: SOUTH CHINA UNIVERSITY OF TECHNOLOGY, Guangdong (CN)

(72) Inventors: Ting Guo, Guangdong (CN); Feng Peng, Guangdong (CN); Lei Ying, Guangdong (CN); Wei Yang, Guangdong (CN); Junbiao Peng, Guangdong (CN); Yong Cao, Guangdong (CN)

(73) Assignee: SOUTH CHINA UNIVERSITY OF TECHNOLOGY, Guangdong (CN)

(*) Notice: Subject to any disclaimer, the term of this patent is extended or adjusted under 35 U.S.C. 154(b) by 112 days.

(21) Appl. No.: 16/467,987

(22) PCT Filed: Nov. 27, 2017

(86) PCT No.: PCT/CN2017/113025
§ 371 (c)(1),
(2) Date: Jun. 10, 2019

(87) PCT Pub. No.: WO2018/103547
PCT Pub. Date: Jun. 14, 2018

(65) Prior Publication Data
US 2020/0109237 A1    Apr. 9, 2020

(30) Foreign Application Priority Data
Dec. 9, 2016 (CN) .......... 201611125626.0

(51) Int. Cl.
*C08G 61/12* (2006.01)
*H01L 51/00* (2006.01)

(52) U.S. Cl.
CPC ........ *C08G 61/126* (2013.01); *H01L 51/0036* (2013.01); *C08G 2261/1644* (2013.01);
(Continued)

(58) Field of Classification Search
CPC .......... C08G 61/126; C08G 2261/1644; C08G 2261/3243; C08G 2261/411;
(Continued)

(56) References Cited

U.S. PATENT DOCUMENTS

2002/0173617 A1* 11/2002 Yasuda ............... H01L 51/5012
528/422
2013/0043461 A1   2/2013 Hirose et al.

FOREIGN PATENT DOCUMENTS

CN   101710674   5/2010
CN   102093232   6/2011
(Continued)

OTHER PUBLICATIONS

Miteva, et al., Adv. Mater. 2001, 13, No. 8 (565-570).*
(Continued)

*Primary Examiner* — Shane Fang
(74) *Attorney, Agent, or Firm* — JCIPRNET

(57) ABSTRACT

Provided are a polymer containing S,S-dioxide-dibenzothiophene in backbone chain with content-adjustable triarylamine end groups, and a preparation method and an application thereof. Triarylamines hole-transport small molecules are introduced into the polymer end group, and a content of the triarylamine end groups can be adjusted by controlling a polymer molecular weight, so that the polymer has better electron-transport and hole-transport capabilities, and charge carrier transport can be balanced, so that more (Continued)

exciton recombination takes place effectively, thus improving the luminous efficiency and stability of the polymer. The polymer is prepared by a Suzuki polymerization reaction and does not require synthesis of new monomers. The polymer material is used for preparing highly effective and stable monolayer devices, and is dissolved directly in an organic solvent, then spin-coated, ink-jet printed, or printed to form a film.

8 Claims, 2 Drawing Sheets

(52) U.S. Cl.
CPC ............... *C08G 2261/3243* (2013.01); *C08G 2261/411* (2013.01); *C08G 2261/512* (2013.01); *C08G 2261/514* (2013.01); *C08G 2261/52* (2013.01); *C08G 2261/95* (2013.01)

(58) Field of Classification Search
CPC ........ C08G 2261/512; C08G 2261/514; C08G 2261/52; C08G 2261/95; H01L 51/0036
See application file for complete search history.

(56) References Cited

FOREIGN PATENT DOCUMENTS

| CN | 102850528 | 1/2013 |
|----|-----------|--------|
| CN | 103073534 | 5/2013 |
| CN | 106633002 | 5/2017 |

OTHER PUBLICATIONS

Yu et al.,"Red, Green, and Blue Light-Emitting Polyfluorenes Containing a Dibenzothiophene-S, S-Dioxide Unit and Efficient High-Color-Rendering-Index White-Line Emitting Diodes Made Therefrom," Advanced Functional Materials Apr. 2, 2013, pp. 4366-4376.

Kamtekar et al., "Synthesis and Spectroscopy of Poly(9,9-dioctylfuorene-2,7-diyl-co-2,8-dihexyldibenzothiophene-S, S-dioxide-3,7-diyl)s: Solution-Processable, Deep-Blue Emitters with a High Triplet Energy," Macromolecules, Apr. 29, 2010, pp. 4481-4488.

"International Search Report (Form PCT/ISA/210)", dated Feb. 26, 2018, with English translation thereof, pp. 1-4.

* cited by examiner

POLYMER CONTAINING S,S-DIOXIDE-DIBENZOTHIOPHENE IN BACKBONE CHAIN WITH CONTENT-ADJUSTABLE TRIARYLAMINE END GROUPS AND PREPARATION METHOD AND APPLICATION THEREOF

CROSS-REFERENCE TO RELATED APPLICATION

This is a 371 application of the International PCT application serial no. PCT/CN2017/113025, filed on Nov. 27, 2017, which claims the priority benefits of China Application No. 201611125626.0, filed on Dec. 9, 2016. The entirety of each of the above-mentioned patent applications is hereby incorporated by reference herein and made a part of this specification.

BACKGROUND

Technical Field

The present invention relates to the field of organic photoelectric luminescent materials, and in particular, to a polymer containing S,S-dioxide-dibenzothiophene in backbone chain with content-adjustable triarylamine end groups, and a preparation method and an application thereof.

Description of Related Art

In 1990, Cavendish Laboratory of Cambridge University published the first polymer thin film electroluminescent device made of conjugated polymer PPV, thus officially kicking off the prelude of studies on polymer light emitting diodes (PLED). Like small molecular light-emitting diodes, the polymer light-emitting diodes also have the advantages of high efficiency, low voltage drive, and easy preparation in large areas. In addition, the polymer light-emitting diodes further have unique advantages thereof: (1) thin films can be prepared in large areas by spin-coating, roll-to-roll and other methods; (2) electronic structures and light emitting colors of the conjugated polymers can be easily adjusted through chemical structure changes and modifications; and (3) the conjugated polymers can avoid crystallization through modification, thus improving device stability.

A PLED device is composed of a cathode, an anode and an intermediate organic layer. The organic layer generally includes an electron-transport layer, a light emitting layer and a hole-transport layer. First, electrons and holes are injected from the cathode and the anode respectively and migrated in a functional layer respectively. Then the electrons and the holes form excitons at appropriate positions. The excitons migrate within a certain range and finally emit light.

A light emitting material of the polymer containing S,S-dioxide-dibenzothiophene in backbone chain is a star material in the research field of PLED. Martin R. Bryce and Yang Wei's research group has synthesized a series of polymers based on S,S-dioxide-dibenzothiophene with high efficiency in red, green and blue colors [Macromolecules, 2010, 43, 4481-4488; Advanced Functional Materials, 2013, 23, 4366-4376]. However, most of the high-efficiency devices based on S,S-dioxide-dibenzothiophene are implemented in a two-layer device structure, which is typically implemented by adding a layer of PVK as a hole-transport layer between PEDOT:PSS and the light emitting layer. The reason is that the introduction of S,S-dioxide-dibenzothiophene units reduces a HOMO energy level of the polymer, increases the hole injection barrier of the device, and reduces the hole-transport performances. On the other hand, the introduction of S,S-dioxide-dibenzothiophene units greatly increases the electron-transport performances of the polymer. The hole-transport and the electron-transport are traded off so that charge carrier transport of the monolayer device is unbalanced, the probability of exciton recombination is lowered, and the device efficiency and stability are reduced. Therefore, balancing the charge carrier transport is the key to improve the efficiency of the S,S-dioxide-dibenzothiophene polymer device.

SUMMARY

An object of the present invention is to provide a triarylamine-terminated polymer material containing S,S-dioxide-dibenzothiophene in backbone chain with content-adjustable triarylamine end groups with respect to the defect of an unbalanced charge carrier transport of the polymer containing S,S-dioxide-dibenzothiophene in backbone chain.

Triarylamines hole-transport small molecules are introduced at an end group of the polymer material according to the present invention. A triarylamine compound is a typical P-type material having a high hole mobility and a shallow HOMO energy level. Meanwhile, a content of the triarylamine end groups can be adjusted by controlling a polymer molecular weight, so that the polymer has better electron-transport and hole-transport capabilities, and charge carrier transport can be balanced, so that more exciton recombination takes place effectively, thus improving the luminous efficiency and stability of the polymer.

Another object of the present invention is to provide a preparation method of the polymer material containing S,S-dioxide-dibenzothiophene in backbone chain with content-adjustable triarylamine end groups.

Another object of the present invention is to provide an application of the polymer material containing S,S-dioxide-dibenzothiophene in backbone chain with content-adjustable triarylamine end groups in preparing a light emitting layer of a light emitting diode.

A specific technical solution of the present invention is as follows.

A polymer containing S,S-dioxide-dibenzothiophene in backbone chain with content-adjustable triarylamine end groups includes a chemical structural formula as follows:

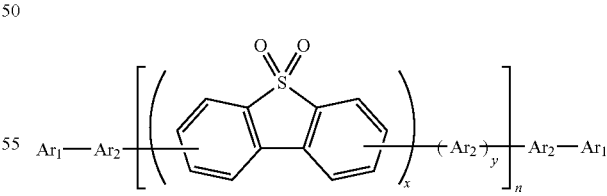

where x and y are mole fractions of monomer components, satisfying: $0 < x \leq 0.5$ and $x+y=1$; n is a number of repeating units, n=10 to 300; $Ar_1$ is a triarylamine terminating unit, and $Ar_2$ is an alkylated aromatic unit.

Further, in the polymer, a molar content of the triarylamine end groups is: mol %=2/n*100%; by controlling the number of repeating units of the polymer as $10 \leq n \leq 300$, the molar content mol % of the triarylamine end groups is controllably adjusted between 0.67% and 20%.

Further, Ar₁ is any of the following chemical structural formulas:
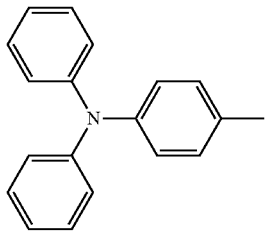
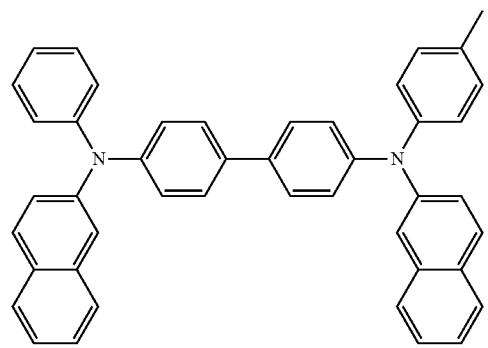
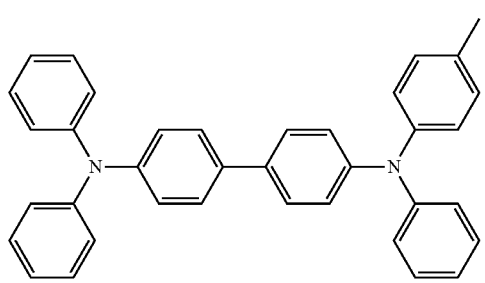
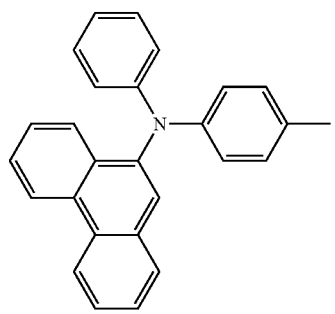
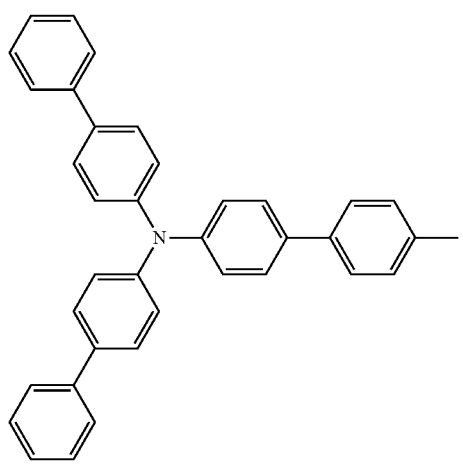
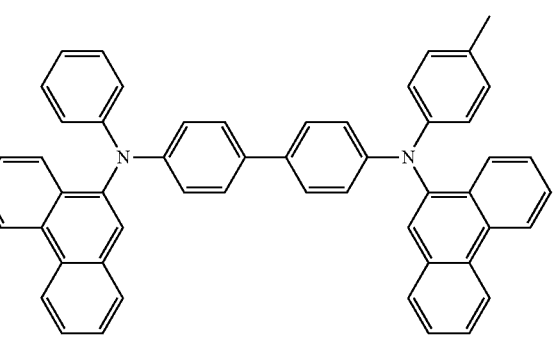
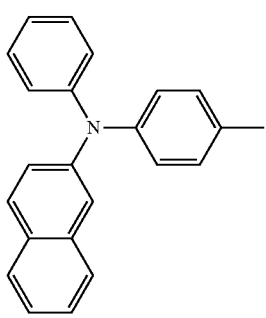
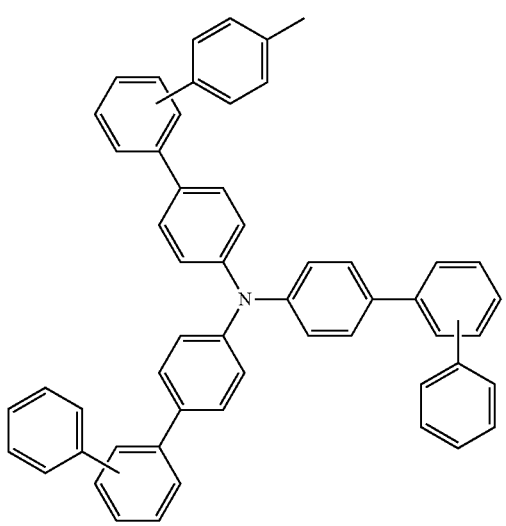

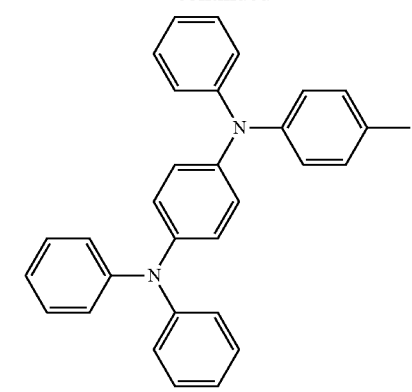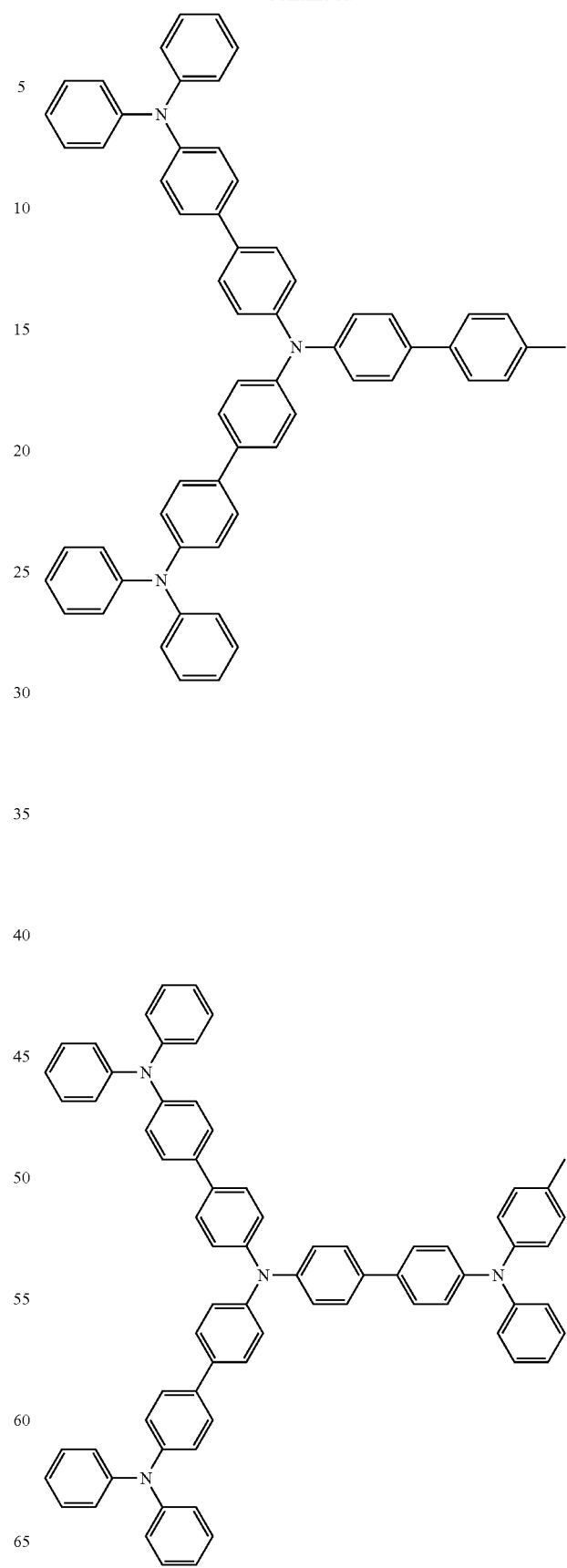

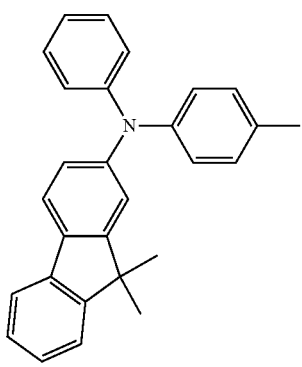
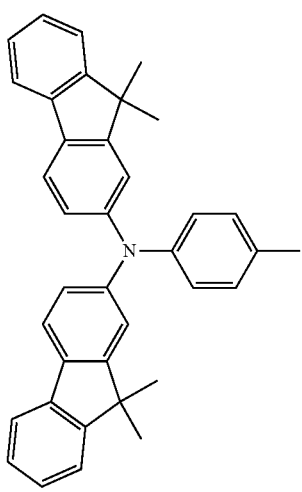
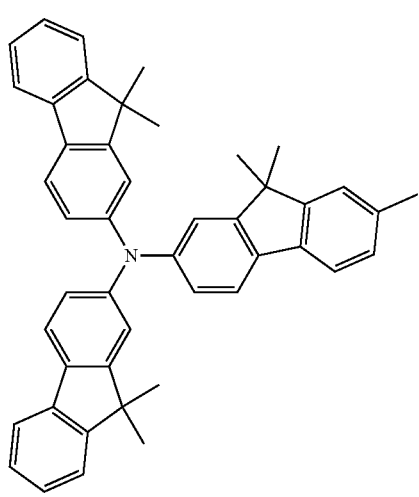
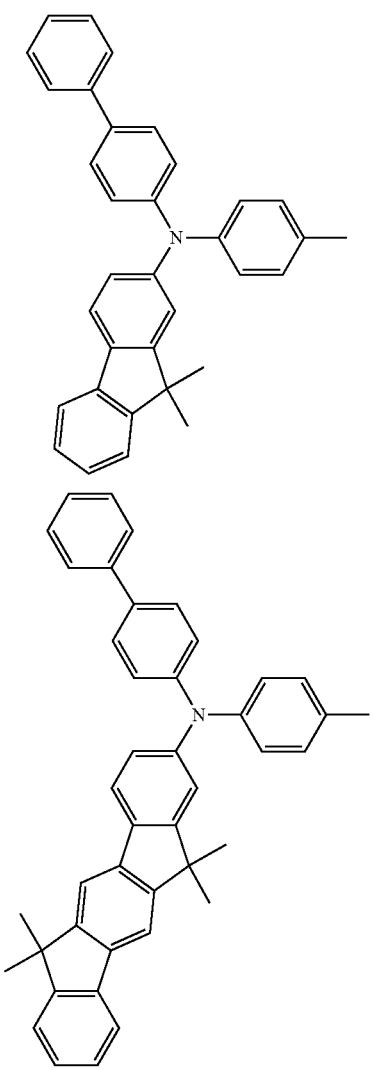
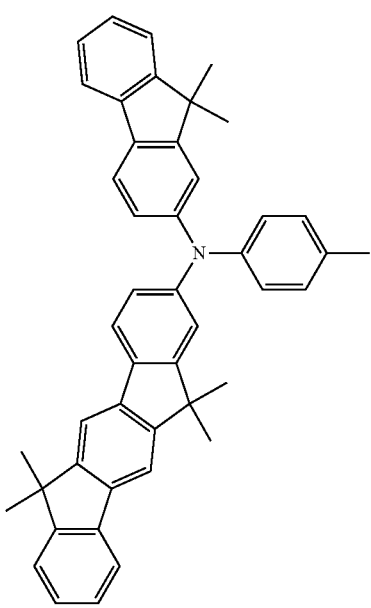

-continued
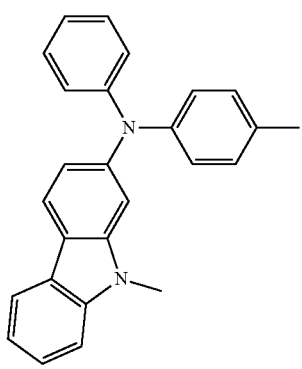
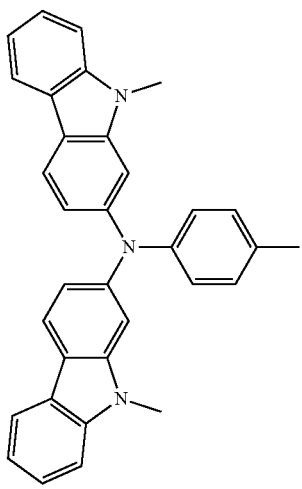
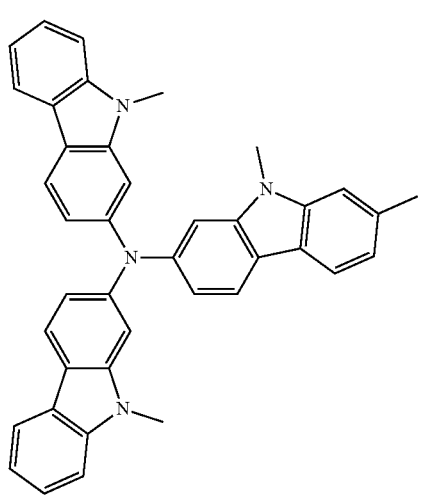
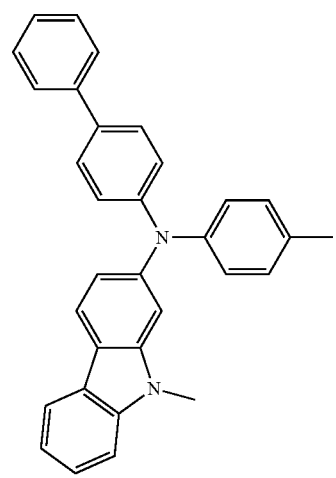
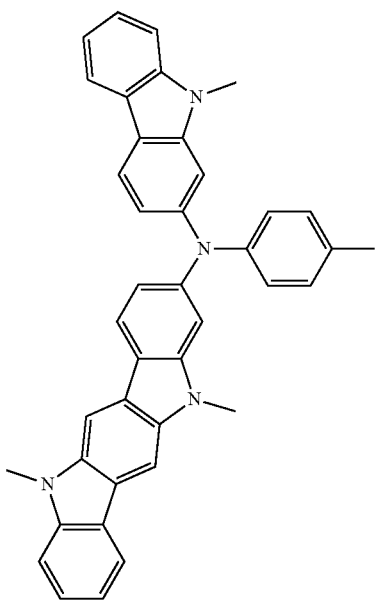

-continued
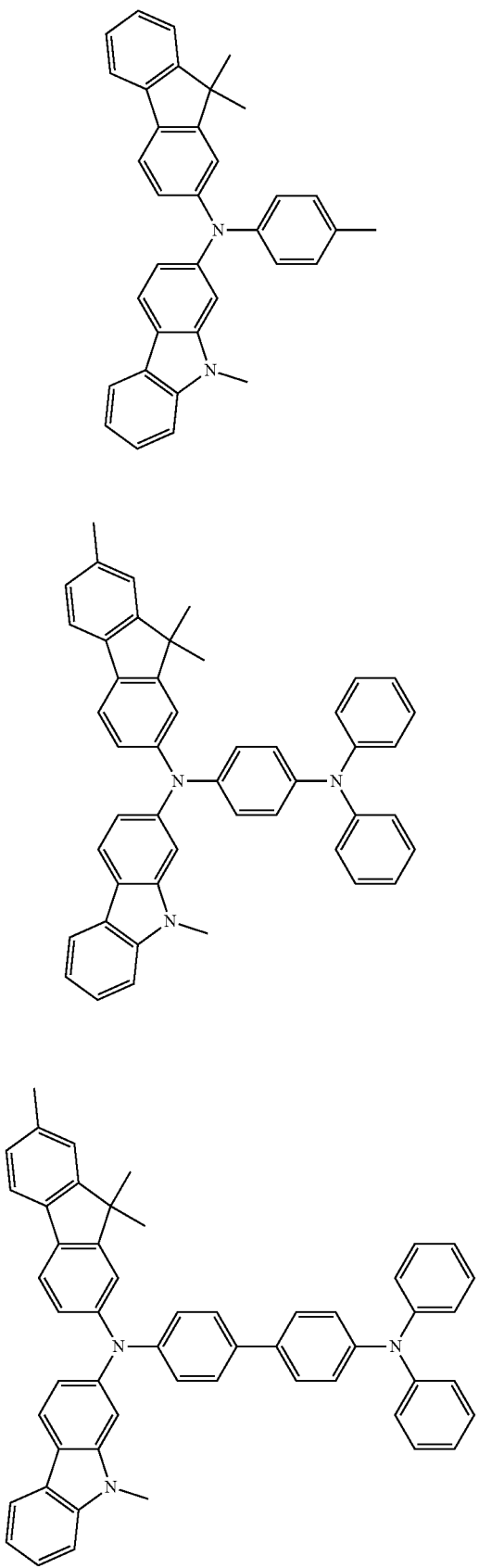 [SMILES: Cc1ccc(N(c2ccc3c(c2)C(C)(C)c2ccccc2-3)c2ccc3c4ccccc4n(C)c3c2)cc1 ; Cc1ccc2c(c1)C(C)(C)c1cc(N(c3ccc(N(c4ccccc4)c4ccccc4)cc3)c3ccc4c5ccccc5n(C)c4c3)ccc1-2 ; Cc1ccc2c(c1)C(C)(C)c1cc(N(c3ccc(-c4ccc(N(c5ccccc5)c5ccccc5)cc4)cc3)c3ccc4c5ccccc5n(C)c4c3)ccc1-2]
Further, Ar$_2$ is one or more of the following chemical structural formulas:
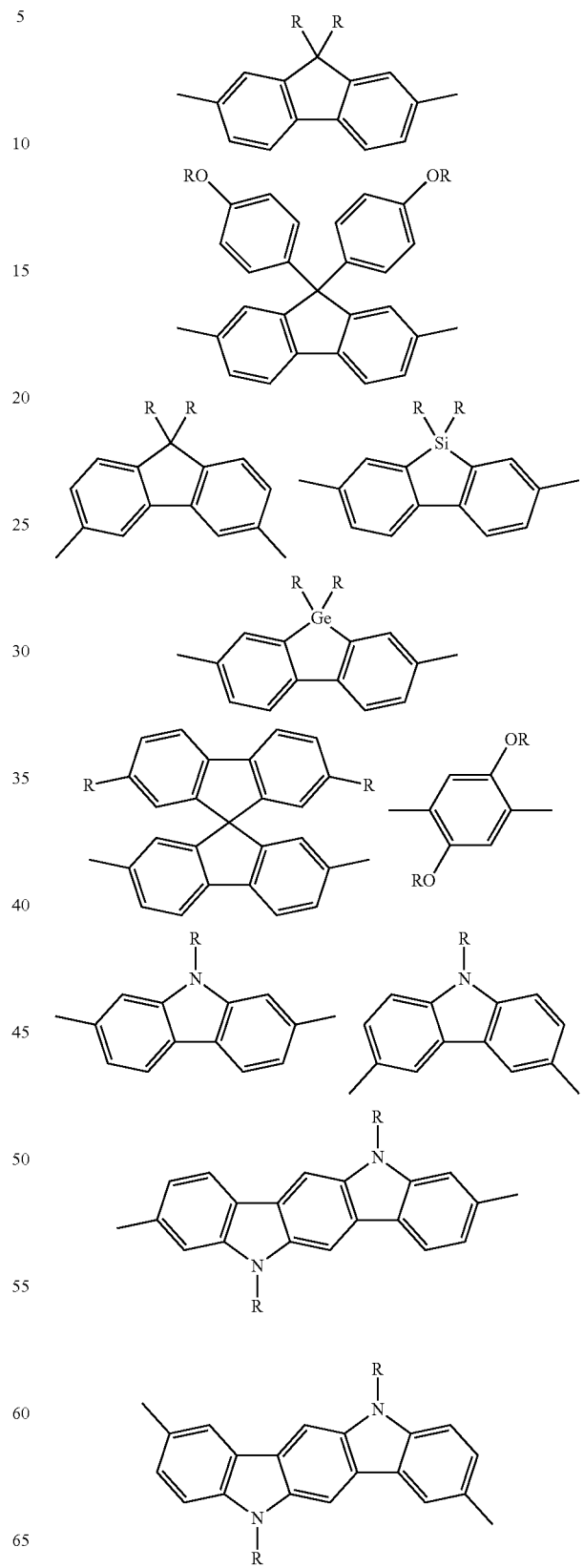

-continued

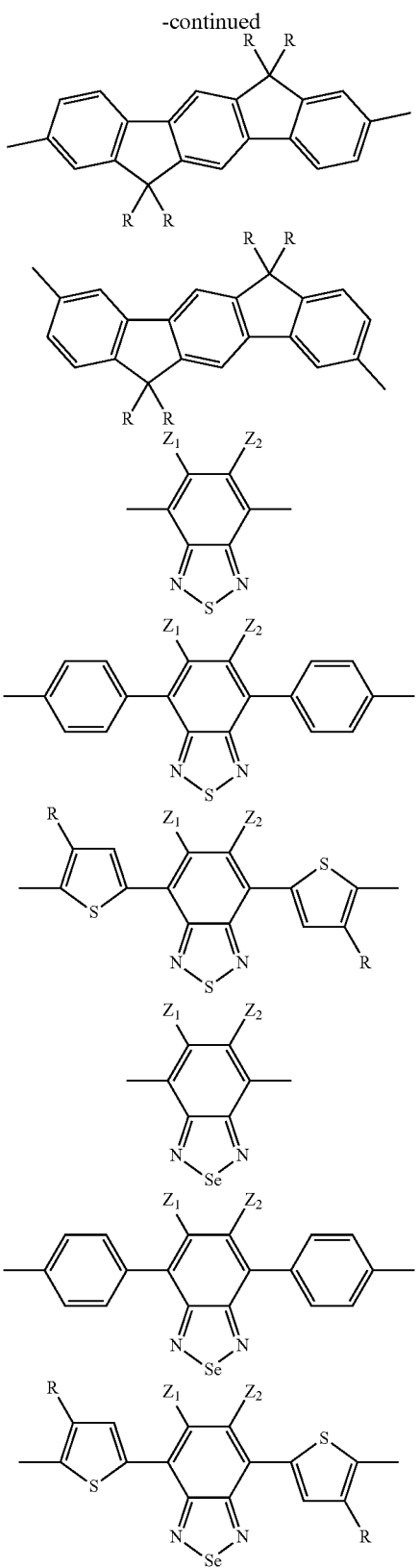

where $Z_1$ or $Z_2$ is H, F, CN, alkenyl, alkynyl, nitrile group, amine group, nitro, acyl, alkoxy, carbonyl or sulfonyl; and R is a linear or branched alkyl or alkoxy having 1 to 30 carbon atoms and a cycloalkyl having 3 to 30 carbon atoms.

A preparation method of the polymer containing S,S-dioxide-dibenzothiophene in backbone chain with content-adjustable triarylamine end groups includes the following steps of:

performing a Suzuki polymerization reaction to dibrominated S,S-dioxide-dibenzothiophene, a bisboronic acid ester of $Ar_2$ and a dibromide of $Ar_2$, and then performing terminating reactions with a bisboronic acid ester monomer of $Ar_2$ and a monobrominated $Ar_1$ monomer successively to obtain the polymer containing S,S-dioxide-dibenzothiophene in backbone chain with content-adjustable triarylamine end groups.

Further, amounts of the dibrominated S,S-dioxide-dibenzothiophene, the bisboronic acid ester of $Ar_2$, and the dibromofluorene of $Ar_2$ satisfy that: a total mole number of the bisboronic acid ester monomers is equal to a total mole number of the dibrominated monomers.

Further, the Suzuki polymerization reaction lasts for 0.5 hour to 16 hours at a temperature of 50° C. to 80° C.

Further, in the terminating reactions, the terminating reactions for the bisboronic acid ester monomer of $Ar_2$ and the monobrominated $Ar_1$ monomer both last for 1 hour to 24 hours at a temperature of 60° C. to 90° C.

Further, a catalytic system of the Suzuki polymerization reaction and the terminating reactions includes a palladium catalyst and a phosphine ligand.

More further, the palladium catalyst includes palladium acetate or tris(dibenzylideneacetone)dipalladium.

More further, the phosphine ligand includes tricyclohexylphosphine or tri-tert-butylphosphine.

The polymer containing S,S-dioxide-dibenzothiophene in backbone chain with content-adjustable triarylamine end groups is applied in preparing a light emitting layer of a light emitting diode, wherein the polymer containing S,S-dioxide-dibenzothiophene in backbone chain with content-adjustable triarylamine end groups is dissolved in an organic solvent, then an organic solution obtained is spin-coated, ink-jet printed, or printed to form a film, thus obtaining the light emitting layer of the light emitting diode. The prepared light emitting diodes can be used in preparing flat panel displays.

Further, the organic solvent includes toluene, chloroform or tetrahydrofuran.

Compared with the prior art, the present invention has the following advantages:

(1) the present invention provides a simple and effective preparation method, which does not need to synthesize new monomers, and introduces triarylamine hole-transport groups into the polymer chain to obtain a polymer with a higher hole injection performance;

(2) in the polymer containing S,S-dioxide-dibenzothiophene in backbone chain with content-adjustable triarylamine end groups according to the present invention, the content of the triarylamine end groups is adjustable, which can obtain polymers with different charge carrier transport performances;

(3) the polymer according to the present invention has better electron-transport and hole-transport capabilities, and can balance the charge carrier transport, so that more exciton recombination takes place effectively, thus improving the luminous efficiency and stability; and (4) when the polymer containing S,S-dioxide-dibenzothiophene in backbone chain with content-adjustable triarylamine end groups according to the present invention is applied in preparing highly effective and stable monolayer devices, the polymer is dissolved directly in an organic solvent, then spin-coated, ink-jet printed, or printed to form a film, and the preparation process is simpler.

DESCRIPTION OF THE EMBODIMENTS

Figure 1:
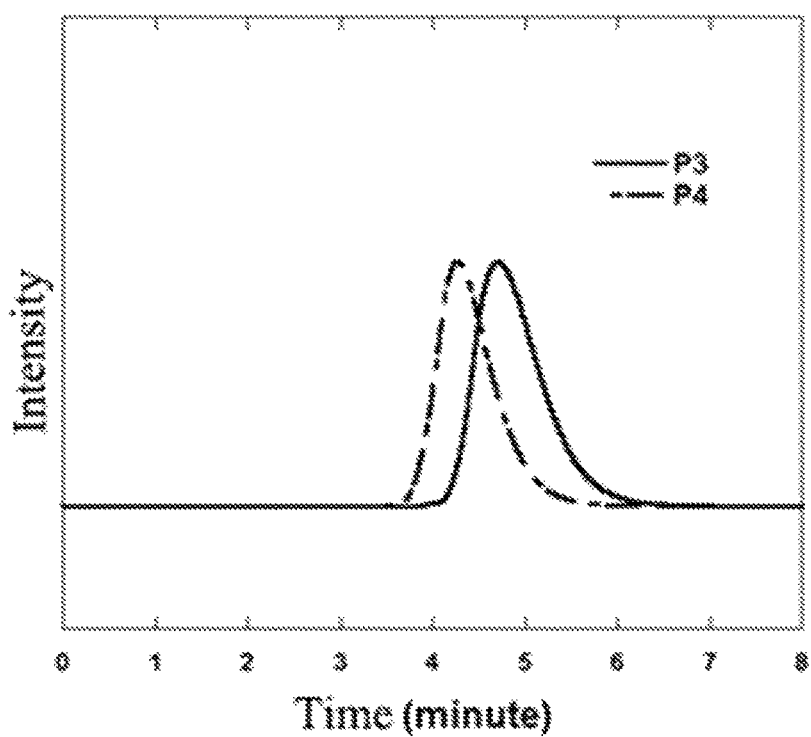
FIG. 1 is a gel permeation chromatogram (GPC) of polymers P3 and P4.

The present invention will be further described in detail hereinafter with reference to the embodiments, but the implementations of the present invention are not limited thereto.

Embodiment 1

Synthesis of poly(2,7-fluorene-co-3,7-S,S-dioxide-dibenzothiophene) with Different Molecular Weights (P1-P6)

Synthesis of polymer P1: under the protection of nitrogen, 2,7-bis(4,4,5,5-tetramethyl-1,3,2-dioxaborolane)-9,9-dioctylfluorene (192.6 mg, 0.3 mmol), 2,7-dibromo-9,9-di-n-octylfluorene (131.6 mg, 0.24 mmol) and 2,7-dibromo-S,S-dioxide-dibenzothiophene (22.4 mg, 0.06 mmol) were dissolved in 8 mL of toluene, then tetraethylhydroxylamine aqueous solution (1 mL, wt %=25%), palladium acetate (2 mg), and tricyclohexylphosphine (4 mg) were added to react at 80° C. for 0.5 hour, and then the reaction was stopped. After cooling, an organic phase was precipitated in methanol (200 mL), filtered and dried to obtain the polymer P1. A polymer molecular weight was obtained by GPC test. (P1: $M_n$=4400, PDI=2.64)

Polymer P2: the reaction conditions were the same as those of the polymer P1 except that the Suzuki polymerization lasted for 1 hour. A polymer molecular weight was obtained by GPC test. (P2: $M_n$=1.04×10$^4$, PDI=2.35)

Polymer P3: the reaction conditions were the same as those of the polymer P1 except that the Suzuki polymerization lasted for 2 hours. A polymer molecular weight was obtained by GPC test. (P3: $M_n$=1.89×10$^4$, PDI=2.42)

Polymer P4: the reaction conditions were the same as those of the polymer P1 except that the Suzuki polymerization lasted for 4 hours. A polymer molecular weight was obtained by GPC test. (P4: $M_n$=2.65×10$^4$, PDI=2.11)

Polymer P5: the reaction conditions were the same as those of the polymer P1 except that the Suzuki polymerization lasted for 8 hours. A polymer molecular weight was obtained by GPC test. (P5: $M_n$=3.38×10$^4$, PDI=1.75)

Polymer P6: the reaction conditions were the same as those of the polymer P1 except that the Suzuki polymerization lasted for 16 hours. A polymer molecular weight was obtained by GPC test. (P6: $M_n$=5.57×10$^4$, PDI=1.94)

FIG. 1 is a gel permeation chromatogram (GPC) of polymers P3 and P4. It can be seen from FIG. 1 that the Suzuki polymerization reaction lasts for different periods of time (the reactions for the polymers P3 and P4 lasted for 2 hours and 4 hours respectively), and the obtained two polymers have different molecular weights; the polymer P3 has a number average molecular weight of $M_n$=1.89×10$^4$ and a polydispersity index (PDI) of 2.42, while the polymer P4 has a number average molecular weight of $M_n$=2.65×10$^4$, and a polydispersity index (PDI) of 2.11.

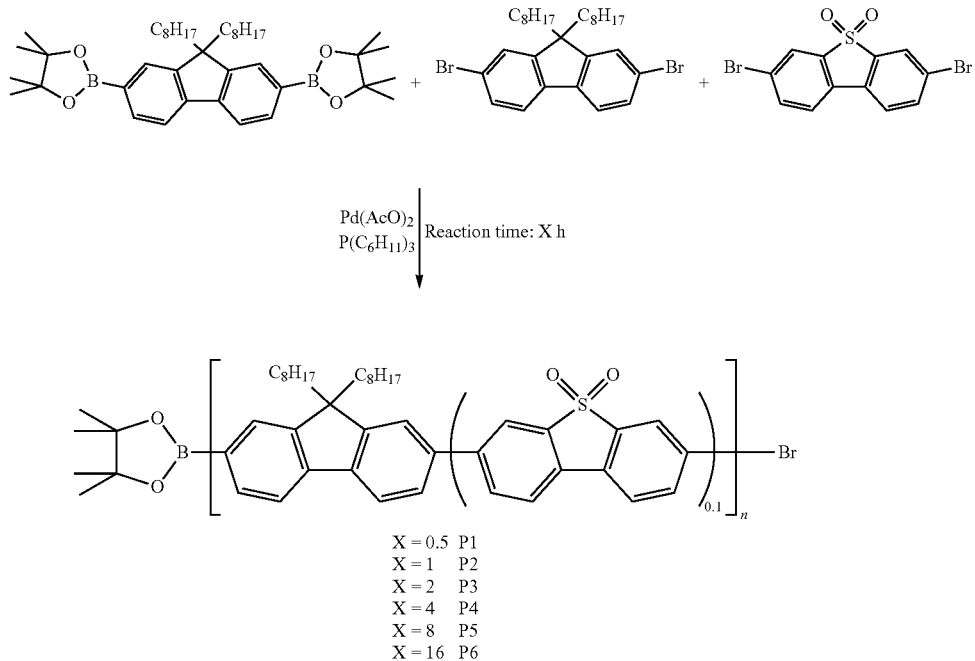

Embodiment 2

Synthesis of poly(2,7-fluorene-co-3,7-S,S-dioxide-dibenzothiophene) with Different Contents of triphenylamine End Group (P7-P12)

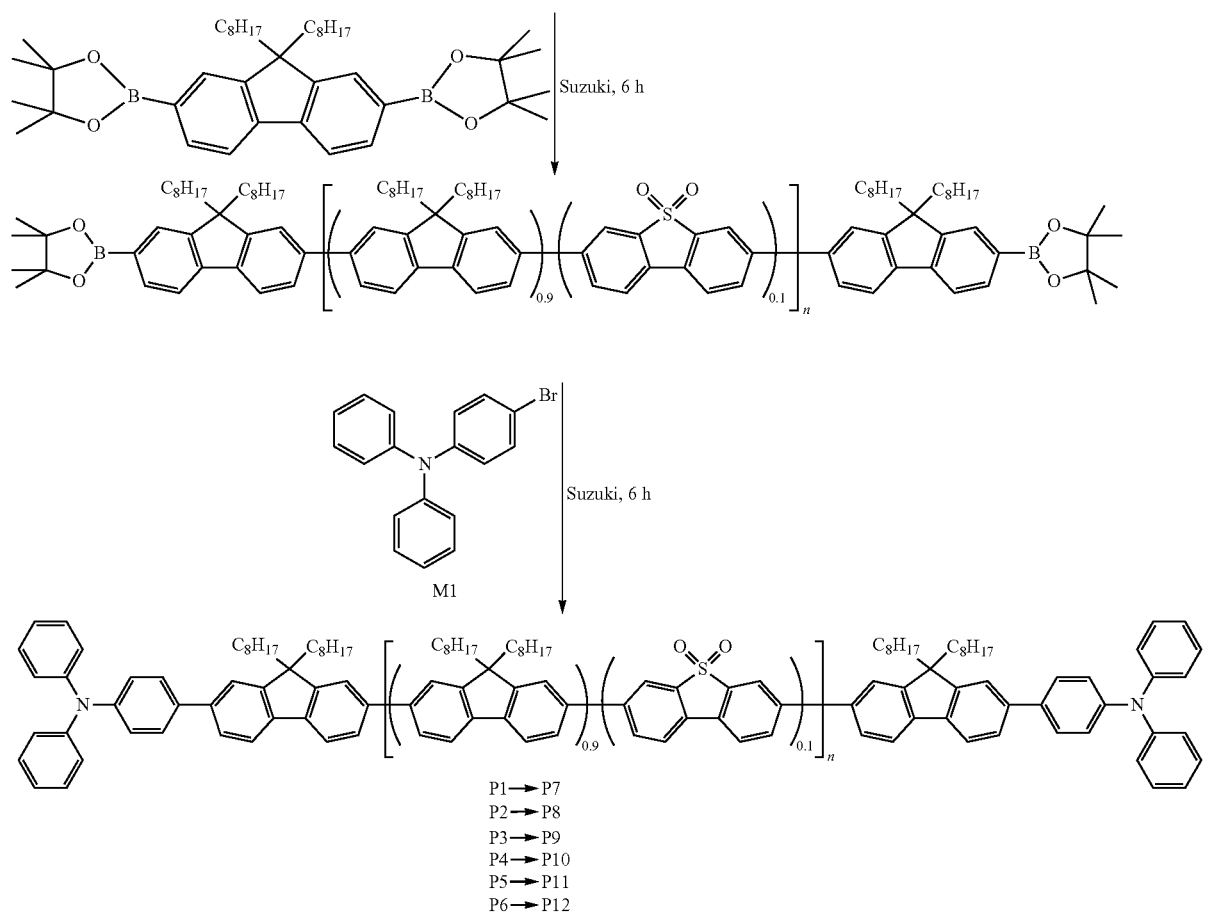

P1, P2, P3, P4, P5, P6

P1→P7
P2→P8
P3→P9
P4→P10
P5→P11
P6→P12

Synthesis of polymer P7: under the protection of nitrogen, the polymer P1 (150 mg) obtained in the embodiment 1 and 2,7-bis(4,4,5,5-tetramethyl-1,3,2-dioxaborolane)-9,9-dioctylfluorene (38.5 mg, 0.06 mmol) were dissolved in 10 mL of toluene, then 1 mL of tetraethylhydroxylamine aqueous solution (1 mL, wt %=25%), palladium acetate (2 mg), and tricyclohexylphosphine (4 mg) were added to react at 80° C. for 6 hours; then, 4-bromo-N,N-diphenylaniline (M1) (77.8 mg, 0.24 mmol) was added to perform a terminating reaction for 6 hours. Then the reaction was stopped. After cooling, an organic phase was precipitated in methanol (200 mL), filtered and dried to obtain a crude product, and then the crude product was extracted successively with methanol, acetone and n-hexane. The polymer was dissolved with toluene, and subjected to column chromatography purification using neutral alumina and using toluene as an eluant. The polymer/toluene solution was concentrated, precipitated again in a methanol solution, filtered, and dried to obtain the pale yellow-green fibrous polymer P7.

$^1$H NMR results indicated that the obtained polymer was the target product; Elemental analysis test showed that a content of the N element in P7 was 0.61%, and a molar content of corresponding triphenylamine was 18.60 mol %.

The synthesis method and conditions of the polymers P8-P12 were the same as those of P7.

P8 was obtained from P2 by two terminating reactions, and elemental analysis test showed that a content of the N element in P8 was 0.25%, and a molar content of corresponding triphenylamine was 7.45 mol %.

P9 was obtained from P3 by two terminating reactions, and elemental analysis test showed that a content of the N element in P9 was 0.15%, and a molar content of corresponding triphenylamine was 4.36 mol %.

P10 was obtained from P4 by two terminating reactions, and elemental analysis test showed that a content of the N element in P10 was 0.11%, and a molar content of corresponding triphenylamine was 3.09 mol %.

P11 was obtained from P5 by two terminating reactions, and elemental analysis test showed that a content of the N element in P11 was 0.08%, and a molar content of corresponding triphenylamine was 2.43 mol %.

P12 was obtained from P6 by two terminating reactions, and elemental analysis test showed that a content of the N element in P12 was 0.05%, and a molar content of corresponding triphenylamine was 1.46 mol %.

Embodiment 3

Synthesis of poly(2,7-fluorene-co-3,7-S,S-dioxide-dibenzothiophene-co-4,7-benzothiadiazole) with Different Molecular Weights (P13-P16)

aqueous solution (1 mL, wt %=25%), palladium acetate (2 mg), and tricyclohexylphosphine (4 mg) were added to react at 50° C. for 8 hours, and then the reaction was stopped. After cooling, an organic phase was precipitated in methanol (200 mL), filtered and dried to obtain the polymer P13. A polymer molecular weight was obtained by GPC test. (P13: $M_n$=8500, PDI=2.55)

Polymer P14: the reaction conditions were the same as those of the polymer P13 except that the Suzuki polymerization was performed at 60° C. A polymer molecular weight was obtained by GPC test. (P14: $M_n$=1.13×10$^4$, PDI=2.28)

Polymer P15: the reaction conditions were the same as those of the polymer P13 except that the Suzuki polymerization was performed at 70° C. A polymer molecular weight was obtained by GPC test. (P15: $M_n$=2.19×10$^4$, PDI=1.95)

Polymer P16: the reaction conditions were the same as those of the polymer P13 except that the Suzuki polymerization was performed at 80° C. A polymer molecular weight was obtained by GPC test. (P16: $M_n$=3.28×10$^4$, PDI=1.83)

By comparing the molecular weights of the polymers P13-P16, it was found that under the conditions of the same

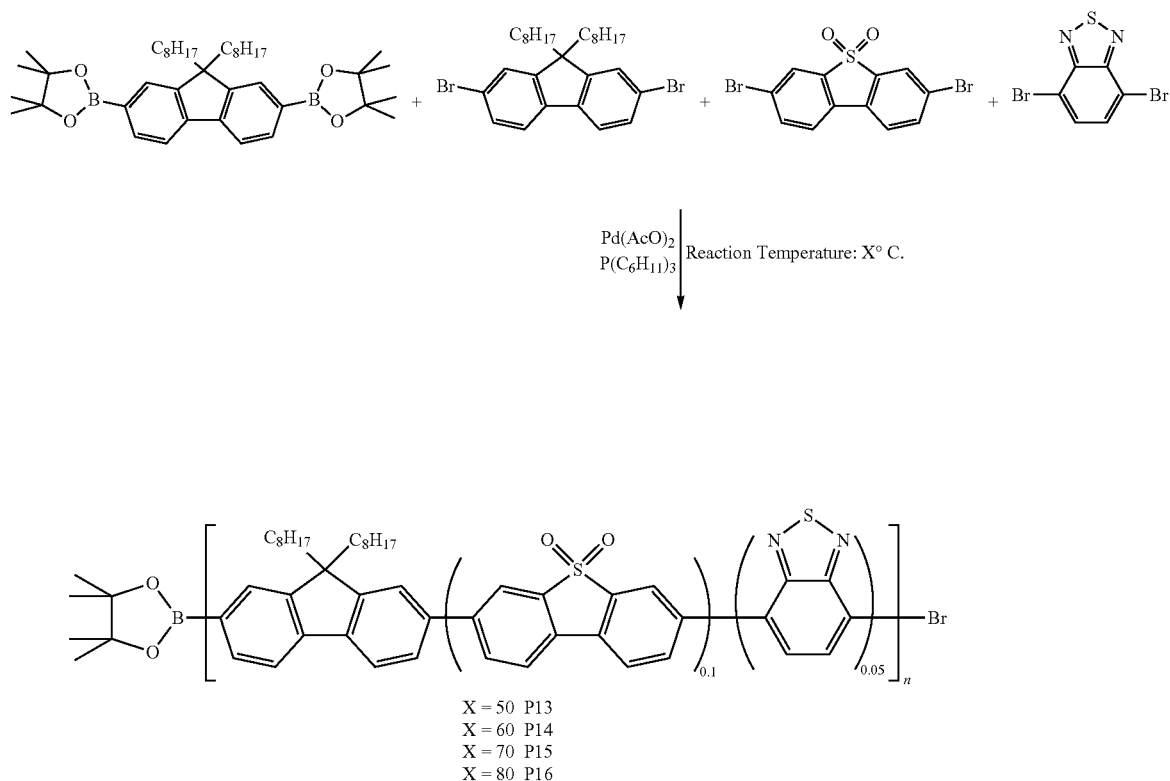

X = 50 P13
X = 60 P14
X = 70 P15
X = 80 P16

Synthesis of polymer P13: under the protection of nitrogen, 2,7-bis(4,4,5,5-tetramethyl-1,3,2-dioxaborolane)-9,9-dioctylfluorene (192.6 mg, 0.3 mmol), 2,7-dibromo-9,9-di-n-octylfluorene (115.2 mg, 0.21 mmol), 2,7-dibromo-S,S-dioxide-dibenzothiophene (22.4 mg, 0.06 mmol) and 4,6-dibromobenzothiadiazole (8.8 mg, 0.03 mmol) were dissolved in 8 mL of toluene, then tetraethylhydroxylamine polymerization catalyst, ligand and reaction time, as the polymerization temperature increases, the molecular weights of the polymers also increase, which achieves the gradient adjustment of the molecular weights. This is because that the polymerization rate increases as the reaction temperature increases.

Embodiment 4

Synthesis of poly(2,7-fluorene-co-3,7-S,S-dioxide-dibenzothiophene-co-4,7-benzothiadiazole) with Different Contents of 7-bromo-N,N-bis(9,9-dimethyl-9H-fluoren-2-yl)-9,9-dimethyl-9H-fluorene-2-amine (M2) End Group (P17-P20)

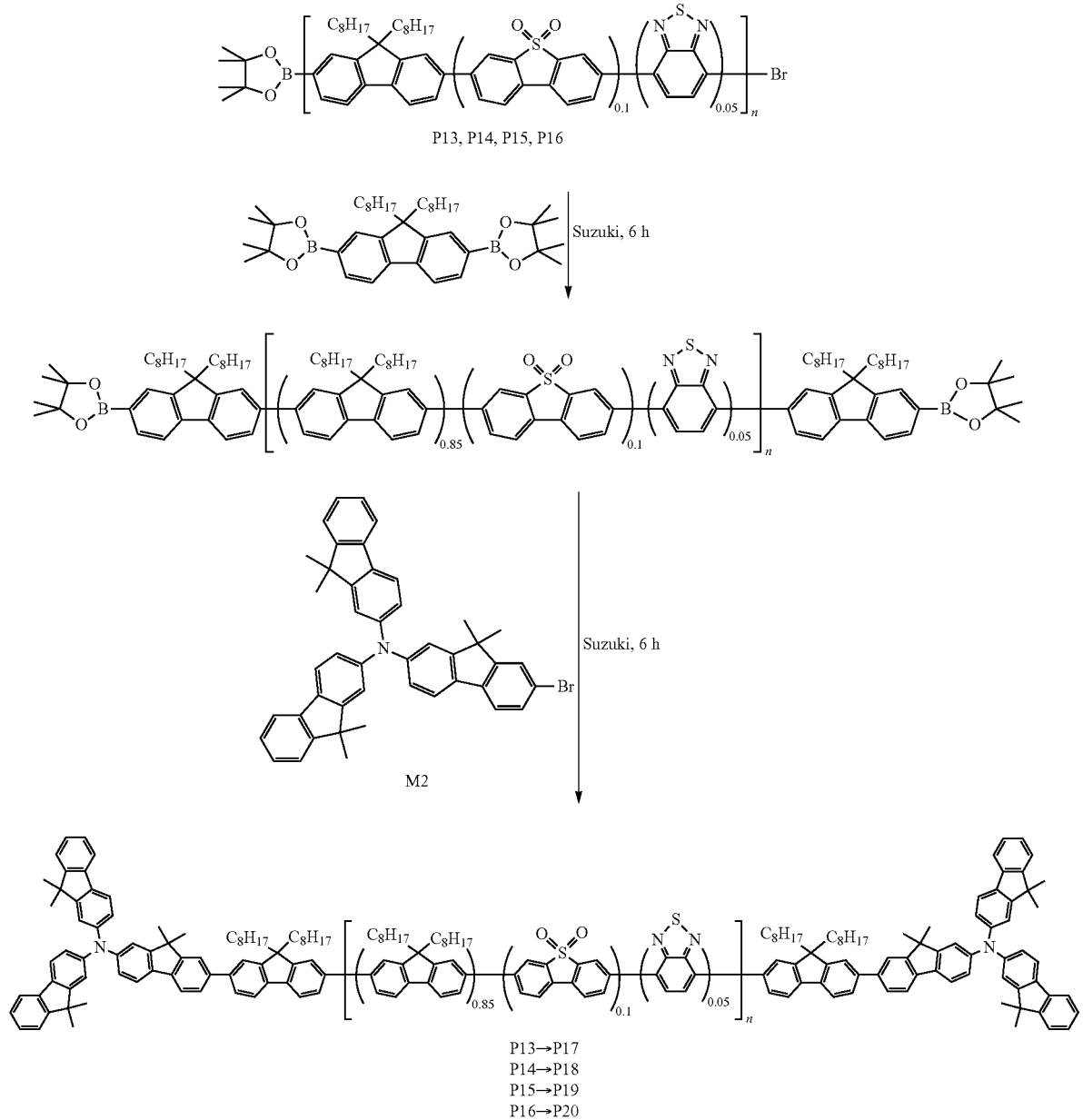

P13, P14, P15, P16

Suzuki, 6 h

Suzuki, 6 h

M2

P13→P17
P14→P18
P15→P19
P16→P20

Synthesis of polymer P17: under the protection of nitrogen, the polymer P13 (150 mg) obtained in the embodiment 3 and 2,7-bis(4,4,5,5-tetramethyl-1,3,2-dioxaborolane)-9,9-dioctylfluorene (38.5 mg, 0.06 mmol) were dissolved in 10 mL of toluene, then 1 mL of tetraethylhydroxylamine aqueous solution (1 mL, wt %=25%), palladium acetate (2 mg), and tricyclohexylphosphine (4 mg) were added to react at 80° C. for 6 hours; then, 7-bromo-N,N-bis(9,9-dimethyl-9H-fluoren-2-yl)-9,9-dimethyl-9H-fluorene-2-amine (M2) (161.4 mg, 0.24 mmol) was added to perform a terminating reaction for 6 hours. Then the reaction was stopped. After cooling, an organic phase was precipitated in methanol (200 mL), filtered and dried to obtain a crude product, and then the crude product was extracted successively with methanol, acetone and n-hexane. The polymer was dissolved with toluene, and subjected to column chromatography purification using neutral alumina and using toluene as an eluent. The polymer/toluene solution was concentrated, precipitated again in a methanol solution, filtered, and dried to obtain the pale yellow-green fibrous polymer P17.

1H NMR results indicated that the obtained polymer was the target product; a molar content of the 7-bromo-N,N-bis(9,9-dimethyl-9H-fluoren-2-yl)-9,9-dimethyl-9H-fluorene-2-amine (M2) was calculated to be 9.65 mol % based on the GPC test results.

The synthesis method and conditions of polymers P18-P20 were the same as those of P17.

P18 was obtained from P14 by two terminating reactions, and a molar content of the 7-bromo-N,N-bis(9,9-dimethyl-9H-fluoren-2-yl)-9,9-dimethyl-9H-fluorene-2-amine (M2) was calculated to be 7.26 mol % based on the GPC test results.

P19 was obtained from P15 by two terminating reactions, and a molar content of the 7-bromo-N,N-bis(9,9-dimethyl-9H-fluoren-2-yl)-9,9-dimethyl-9H-fluorene-2-amine (M2) was calculated to be 3.75 mol % based on the GPC test results.

P20 was obtained from P16 by two terminating reactions, and a molar content of the 7-bromo-N,N-bis(9,9-dimethyl-9H-fluoren-2-yl)-9,9-dimethyl-9H-fluorene-2-amine (M2) was calculated to be 2.50 mol % based on the GPC test results.

Embodiment 5

Synthesis of poly(2,7-fluorene-co-3,7-S,S-dioxide-dibenzothiophene-co-4,7-thienyl-benzothiadiazole) with Different Molecular Weights Synthesis of polymer P21: under the protection of nitrogen, 2,7-bis(4,4,5,5-tetramethyl-1,3,2-dioxaborolane)-9,9-bis(4-(2-ethylhexyloxy)phenyl) fluorene (248.0 mg, 0.30 mmol), 2,7-dibromo-9,9-bis(4-(2-ethylhexyloxy)phenyl) fluorene (153.8 mg, 0.21 mmol), 2,7-dibromo-S,S-dioxide-dibenzothiophene (22.4 mg, 0.06 mmol) and 4,7-bis(5-bromine(4-hexylthiophene)-2-yl)-2,1,3-benzothiadiazole (18.8 mg, 0.03 mmol) were dissolved in 8 mL of toluene, and then tetraethylhydroxylamine aqueous solution (1 mL, wt %=25%), palladium acetate (2 mg) and tricyclic hexylphosphine (4 mg) were added to react at 80° C. for 1 hour, and then the reaction was stopped. After cooling, an organic phase was precipitated in methanol (200 mL), filtered and dried to obtain the polymer P21. A polymer molecular weight was obtained by GPC test. (P21: $M_n=1.92\times10^4$, PDI=2.28)

Polymer P22: the reaction conditions were the same as those of the polymer P20 except that the catalyst and ligand of the Suzuki polymerization reaction were replaced by tris(dibenzylideneacetone)dipalladium and tri-tert-butylphosphine. A polymer molecular weight was obtained by GPC test. (P22: $M_n=9800$, PDI=2.56)

By comparing the molecular weights of the polymers P21 and P22, it was found that under the conditions of the same

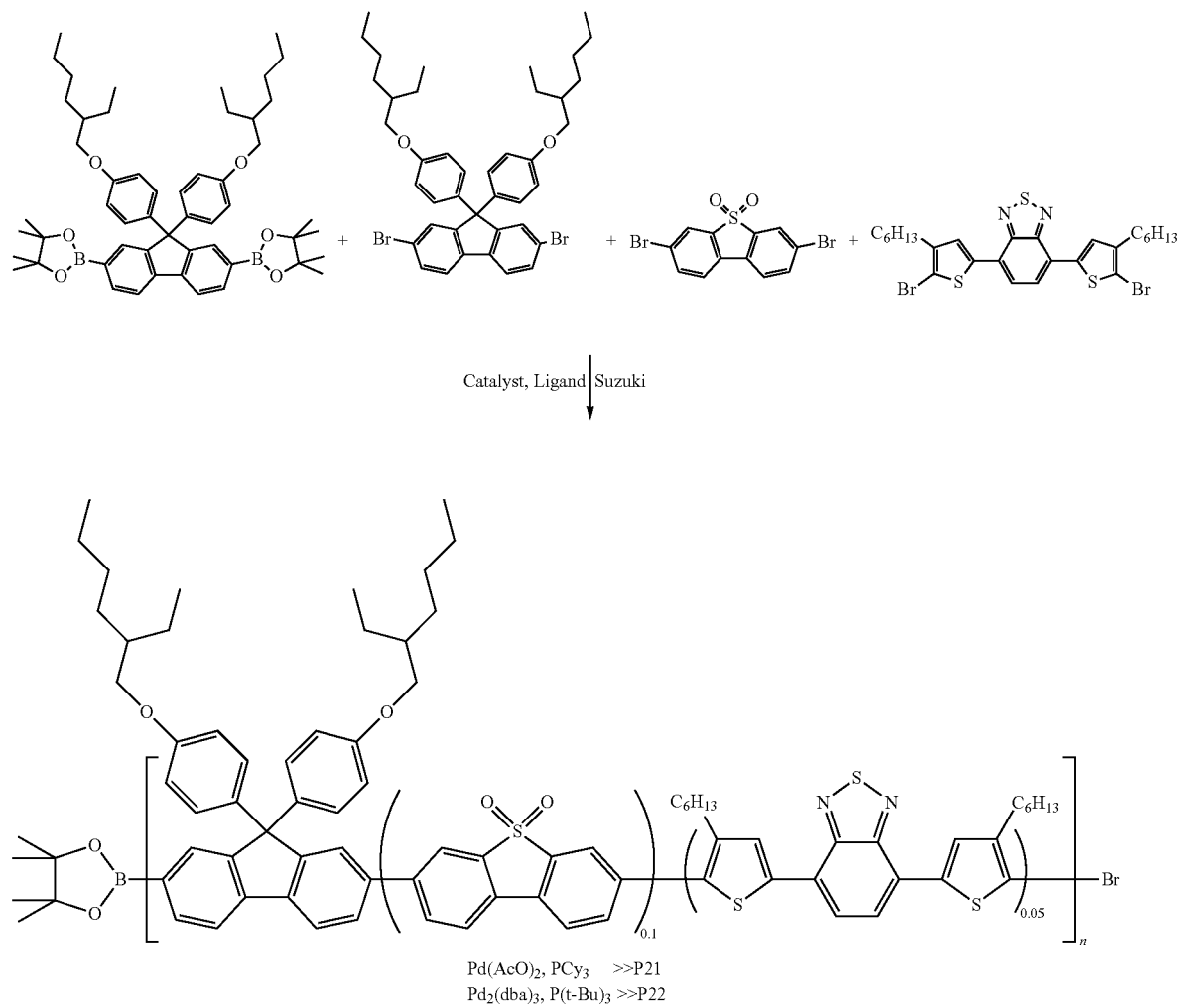

reaction temperature and reaction time, the molecular weight of P21 synthesized by using the palladium acetate as the catalyst and the tricyclohexylphosphine as the ligand was larger than that of P22 synthesized by using the tris (dibenzylideneacetone)dipalladium as the catalyst and tri-tert-butylphosphine as the ligand. In this way, the gradient adjustment of the molecular weights of the polymers was implemented by the differences of catalytic activities of different catalysts and ligands.

Embodiment 6

Synthesis of poly(2,7-fluorene-co-3,7-S,S-dioxide-dibenzothiophene-co-4,7-thienyl-benzothiadiazole) with Different Contents of N4-(4-bromophenyl)-N4, N4',N4"-triphenyl-[1,1'-biphenyl]-4,4'-diamine (M3) Group (P23-P24)

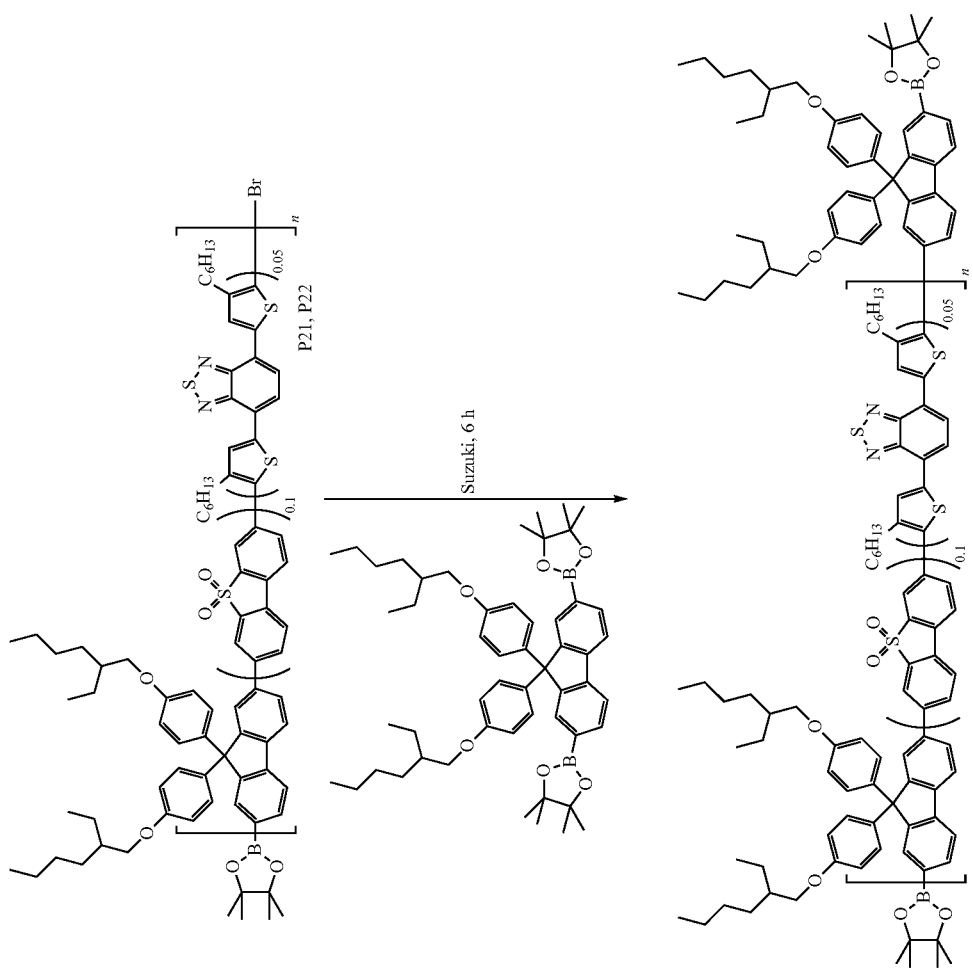

-continued
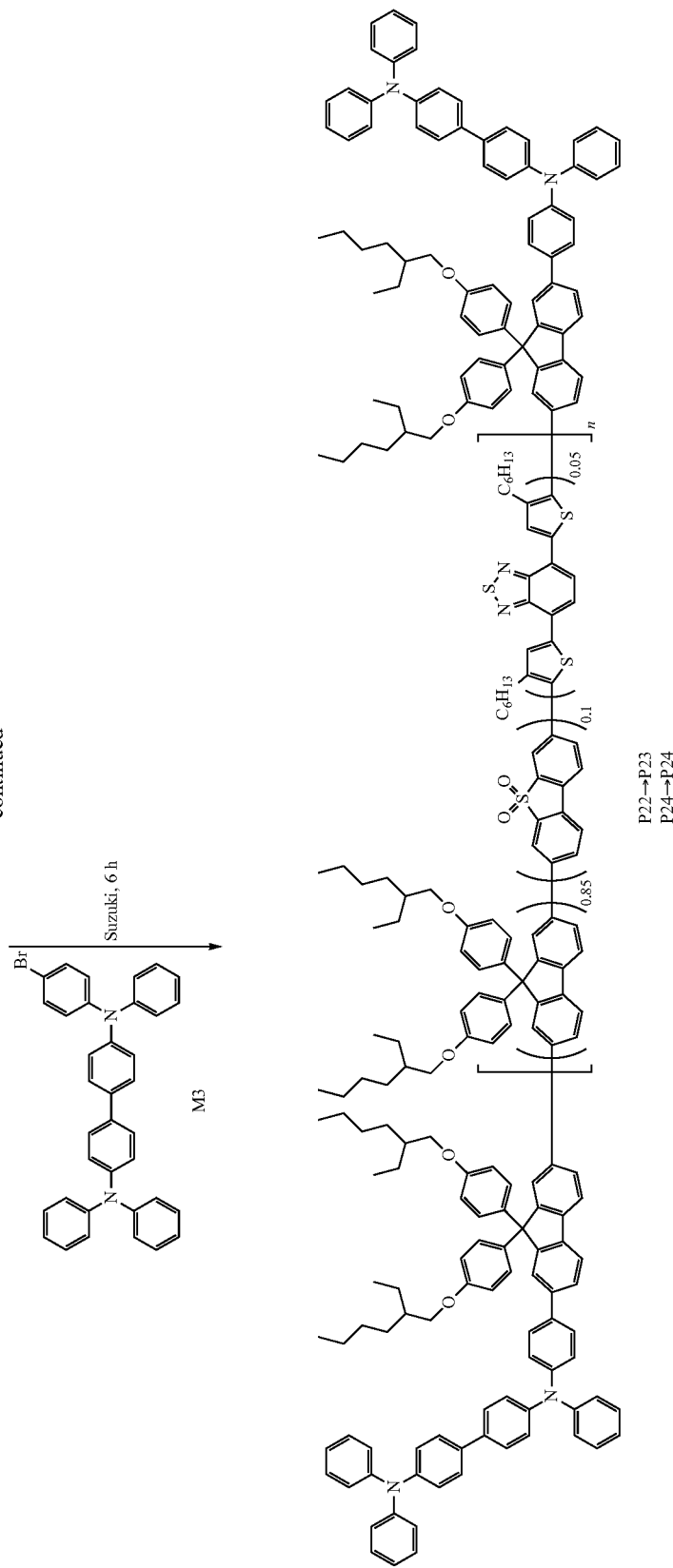

Synthesis of polymer P23: under the protection of nitrogen, the polymer P21 (150 mg) obtained in the embodiment 3 and 2,7-bis(4,4,5,5-tetramethyl-1,3,2-dioxaborolane)-9,9-bis(4-(2-ethylhexyloxy)phenyl)fluorene (49.6 mg, 0.06 mmol) were dissolved in 10 mL of toluene, then 1 mL of tetraethylhydroxylamine aqueous solution (1 mL, wt %=25%), and tetrakis(triphenylphosphine)palladium (10 mg) were added to react at 80° C. for 6 hours; then, $N^4$-(4-bromophenyl)-$N^4$,$N^{4'}$,$N^{4''}$-triphenyl-[1,1'-biphenyl]-4,4'-diamine (M3) (136.2 mg, 0.24 mmol) was added to perform a terminating reaction for 6 hours. Then the reaction was stopped. After cooling, an organic phase was precipitated in methanol (200 mL), filtered and dried to obtain a crude product, and then the crude product was extracted successively with methanol, acetone and n-hexane. The polymer was dissolved with toluene, and subjected to column chromatography purification using neutral alumina and using toluene as an eluent. The polymer/toluene solution was concentrated, precipitated again in a methanol solution, filtered, and dried to obtain the pale yellow-green fibrous polymer P23.

1H NMR results indicated that the obtained polymer was the target product; a molar content of the N4-(4-bromophenyl)-N4,N4',N4"-triphenyl-[1,1'-biphenyl]-4,4'-diamine (M3) was calculated to be 5.59 mol % based on the GPC test results.

The synthesis method and conditions of the P24 were the same as those of P23. P24 was obtained from P22 by two terminating reactions, and a molar content of the N4-(4-bromophenyl)-N4,N4',N4"-triphenyl-[1,1'-biphenyl]-4,4'-diamine (M3) was calculated to be 10.96 mol % based on the GPC test results.

Embodiment 7

Preparation of Polymer Electroluminescent Device

Indium tin oxide (ITO) glass with a square resistance of 10Ω prepared in advance was ultrasonically cleaned with acetone, detergent, deionized water and isopropanol in sequence, and treated with plasma for 10 minutes; a film of poly(3,4-ethylenedioxythiophene) doped with poly(styrenesulfonate) (PEDOT:PSS) with a thickness of 40 nm was spin-coated on the ITO; the PEDOT:PSS film was dried in a vacuum oven at 80° C. for 8 hours; subsequently, a polymer/xylene solution (1 wt. %) was spin-coated on a surface of the PEDOT:PSS film to a thickness of 80 nm; and finally, a CsF layer having a thickness of 1.5 nm and a metal Al layer having a thickness of 120 nm were subjected to vapor deposition on a light emitting layer in sequence. A device structure was ITO/PEDOT:PSS/polymer/CsF/Al.

Figure 2:
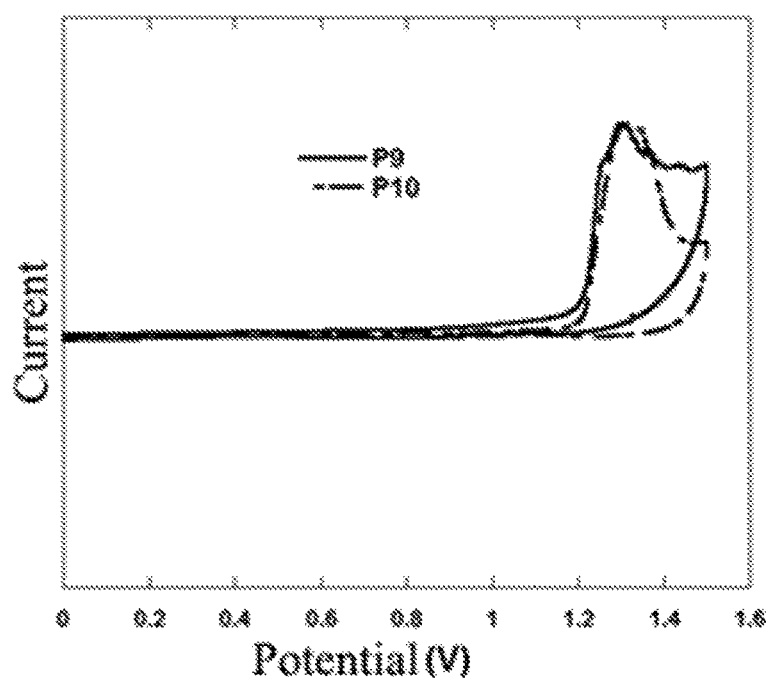
FIG. 2 is a cyclic voltammogram of an electroluminescent device based on polymers P9 and P10.

FIG. 2 is a cyclic voltammogram of an electroluminescent device based on polymers P9 and P10. It can be seen from FIG. 2 that the triphenylamine-terminated polymers P9 and P10 containing S,S-dioxide-dibenzothiophene in backbone chain have lower oxidation potential $E_{ox}$ with a value of 1.2V. According to a formula $E_{HOMO}=-(4.4+E_{ox})$, a corresponding highest occupied molecular orbital (HOMO) energy level is calculated to be −5.6 eV. Compared with similar benzene ring-terminated polymers reported in literatures, the polymers P9 and P10 have a shallower HOMO energy level [Organic Electronics, 2009, 10,901-909], which are more favorable for hole injection.

Figure 3:
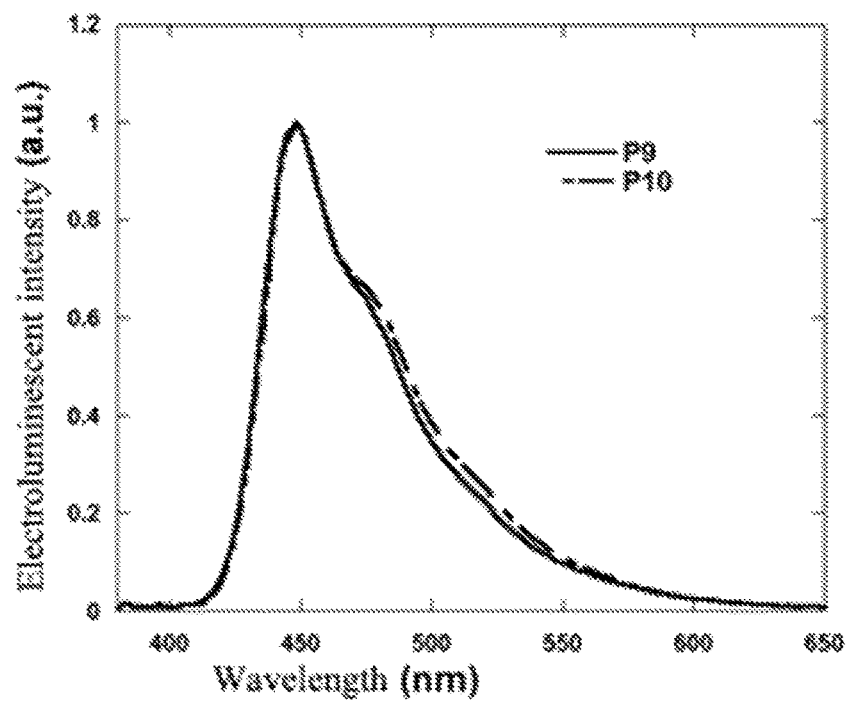
FIG. 3 is electroluminescent spectra of the electroluminescent device based on the polymers P9 and P10.

FIG. 3 is electroluminescent spectra of the electroluminescent device based on the polymers P9 and P10. It can be seen from FIG. 3 that maximum electroluminescence peaks of the polymers P9 and P10 are all located at 440 nm, the effects of different contents of triphenylamine end group on electroluminescence spectrums of the polymer containing S,S-dioxide-dibenzothiophene in backbone chain are not obvious, and the resulting polymers P9 and P10 still emit blue light.

Figure 4:
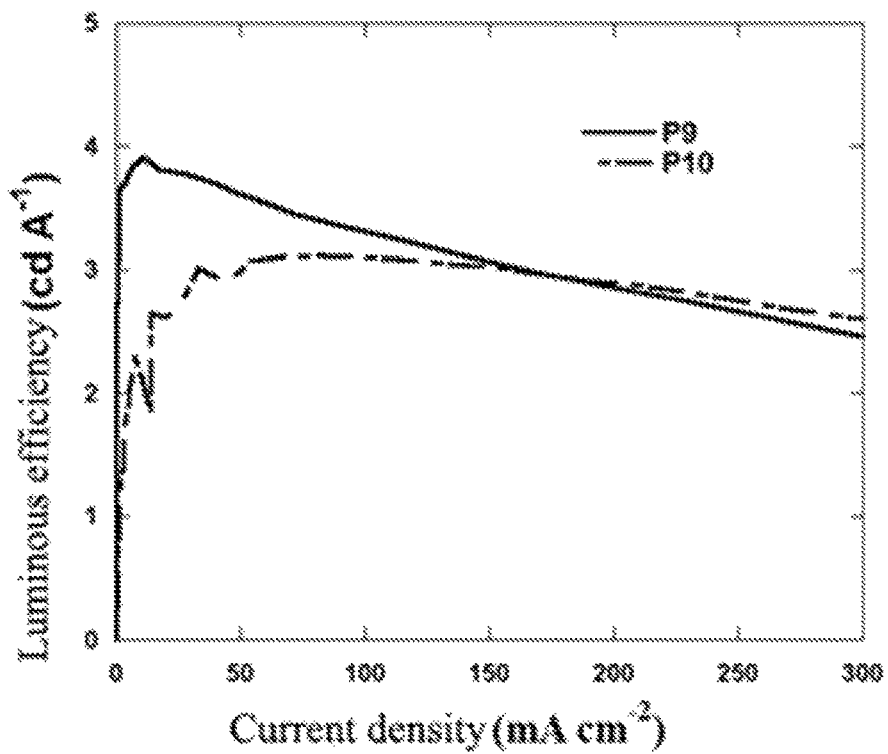
FIG. 4 is luminous efficiency-current density curves of a monolayer device based on the polymers P9 and P10.

FIG. 4 is luminous efficiency-current density curves of a monolayer device based on the polymers P9 and P10. It can be seen from FIG. 4 that the luminous efficiency of the polymer P9 is close to 4.0 cd/A, the luminous efficiency of the polymer P10 is more than 3.0 cd/A, and the polymer P9 having a higher content of the triphenylamine end groups has a higher luminous efficiency than that of the P10, indicating that the introduction of the triphenylamine end group improves the hole injection and transport capabilities, so that charge carrier transport in the luminescent polymer is more balanced and the efficiency is improved.

Performances of electroluminescent devices prepared by using the polymers P19, P20, P23 and P24 as light-emitting layers are respectively shown in Table 1.

TABLE 1

Performances of polymer electroluminescent device

| Polymer | Turn-on voltage (V) | Maximum luminous efficiency (cd/A) | Maximum brightness (cd/m²) | Commission Internationale de L'Eclairage (CIE) coordinates (x, y) |
| --- | --- | --- | --- | --- |
| P19 | 3.0 | 10.3 | 9856 | (0.39, 0.55) |
| P20 | 3.2 | 9.5 | 7839 | (0.39, 0.57) |
| P23 | 4.4 | 3.0 | 1686 | (0.65, 0.34) |
| P24 | 4.2 | 2.7 | 1436 | (0.65, 0.33) |

It can be seen from Table 1 that the polymer P19 has a turn-on voltage of 3.0 V, a luminous efficiency of 10.3 cd/A, a maximum brightness of 9856 cd/m², and a CIE coordinate of (0.39, 0.55); and the polymer P20 has a turn-on voltage of 3.2 V, a luminous efficiency of 9.5 cd/A, a maximum brightness of 7839 cd/m², and a CIE coordinate of (0.39, 0.57). By comparison, it can be found that both the polymers P19 and P20 have a lower turn-on voltage and a higher brightness, and the effects of different contents of triarylamine end group on the CIE coordinate of the device are not obvious; and the device of the polymer P19 with a higher content of triarylamine end group is more efficient than that of the polymer P20. The polymer P23 has a turn-on voltage of 4.4 V, a luminous efficiency of 3.0 cd/A, a maximum brightness of 1686 cd/m², and a CIE coordinate of (0.65, 0.34), and the polymer P24 has a turn-on voltage of 4.2 V, a luminous efficiency of 2.7 cd/A, a maximum brightness of 1436 cd/m², and a CIE coordinate of (0.65, 0.33). And the efficiencies of the monolayer devices of the polymers P19, P20, P23 and P24 are significantly higher than the efficiency of the monolayer device of a benzene-terminated polymer with similar backbone structure [Advanced Functional Materials, 2013, 23, 4366-4376].

The above embodiments are preferred embodiments of the present invention, but the embodiments of the present invention are not limited to the above embodiments, and any other changes, modifications, substitutions, combinations, and simplifications made without departing from the spirit and scope of the present invention should be equivalent replacement means, and are included in the protection scope of the present invention.

What is claimed is:

1. A polymer containing S,S-dioxide-dibenzothiophene in backbone chain with triarylamine end groups, comprising a structural formula as follows:

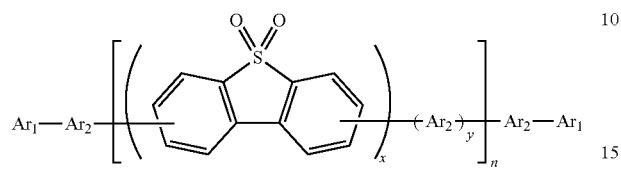

wherein x and y are mole fractions of monomer components, satisfying: $0 < x \leq 0.5$ and $x+y=1$; n is a number of repeating units, n=10 to 300;

$Ar_1$ is any one of the following chemical structural formulas containing the triarylamine end groups:

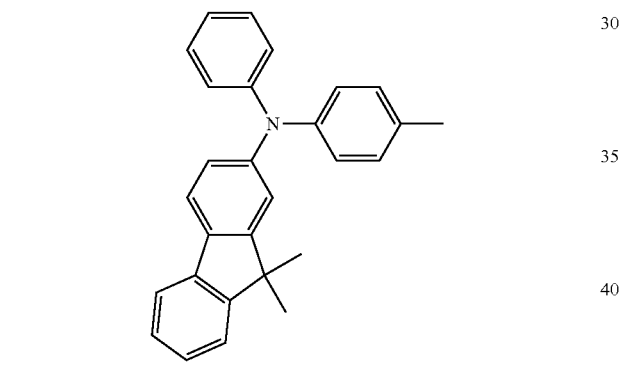

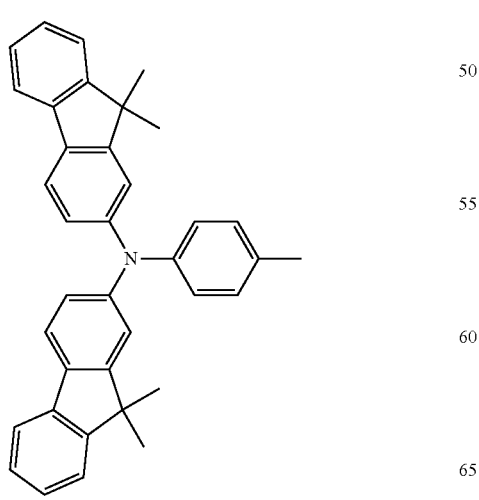

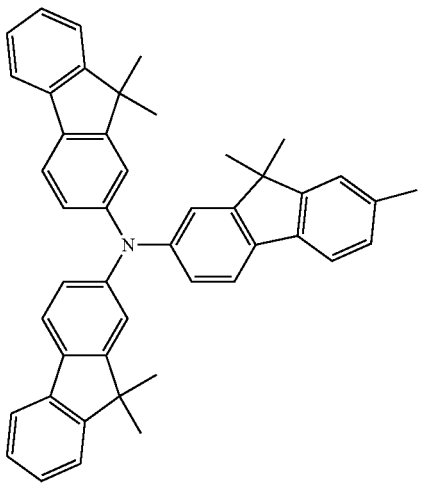

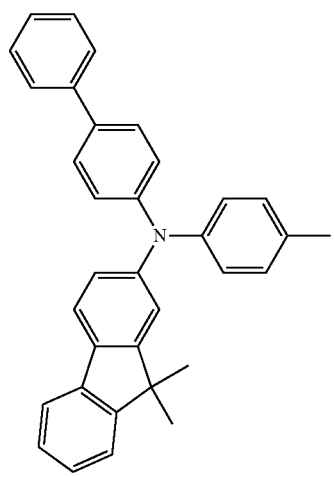

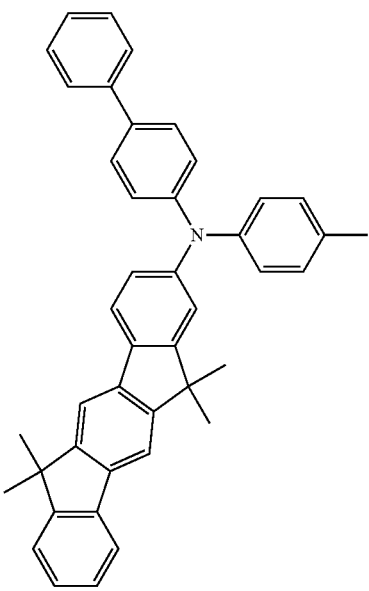

35
-continued
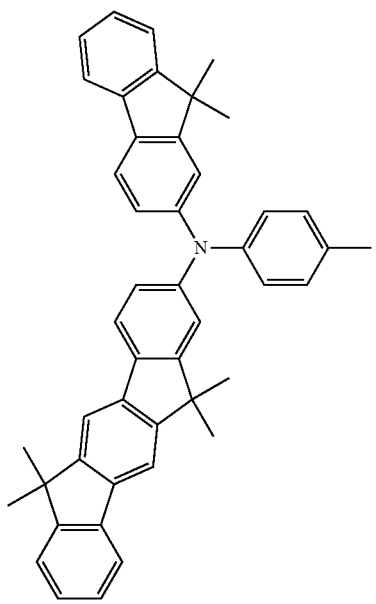
36
-continued
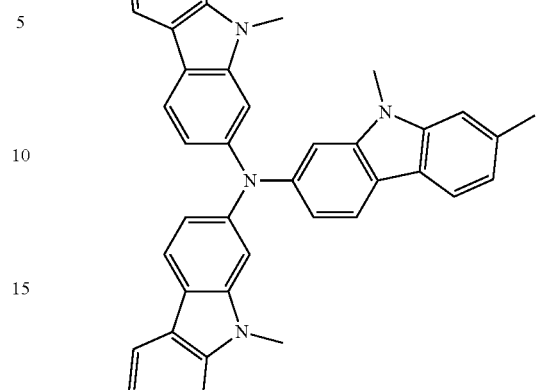
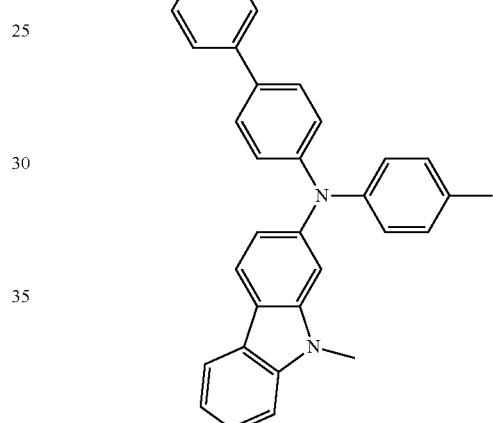
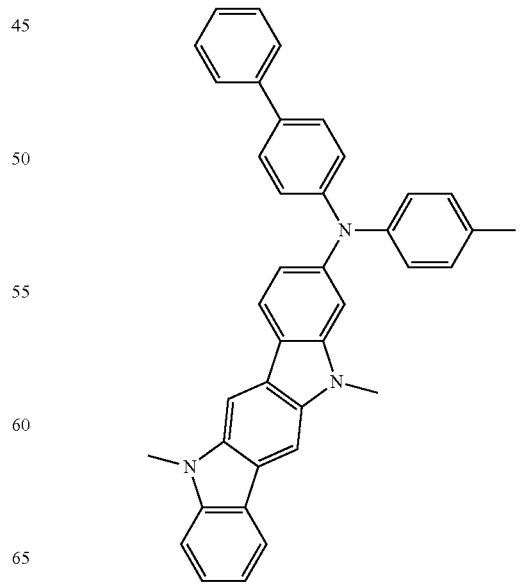

-continued
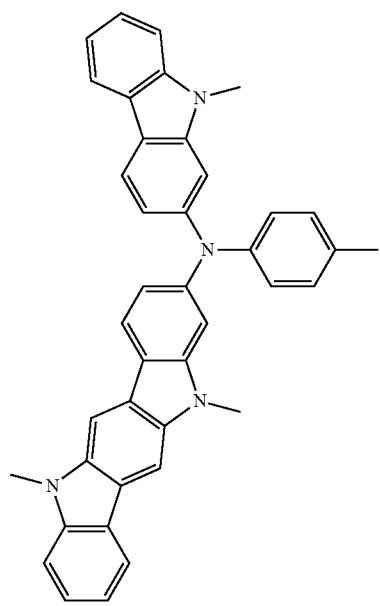
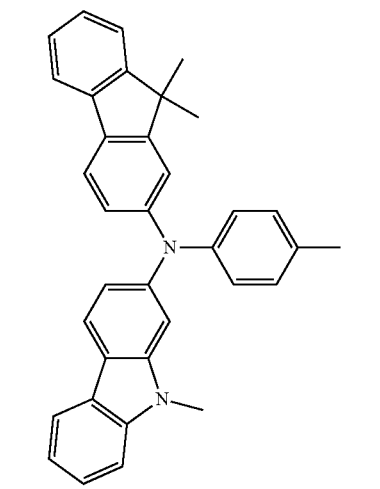
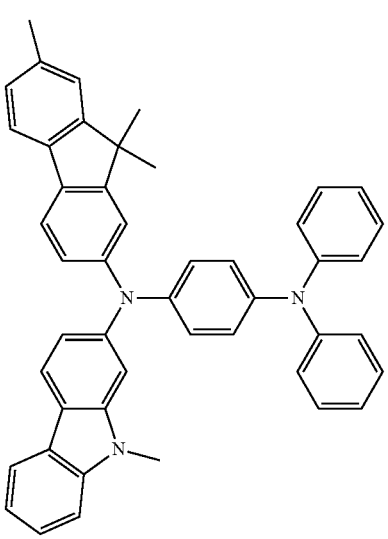
-continued
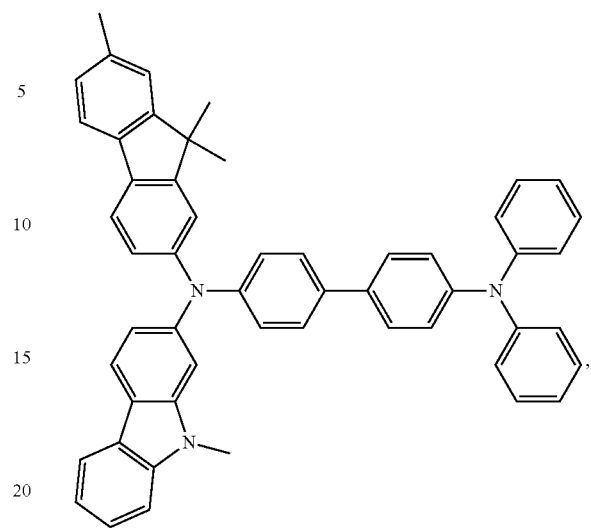
Ar$_2$ is one or more of the following chemical structural formulas:
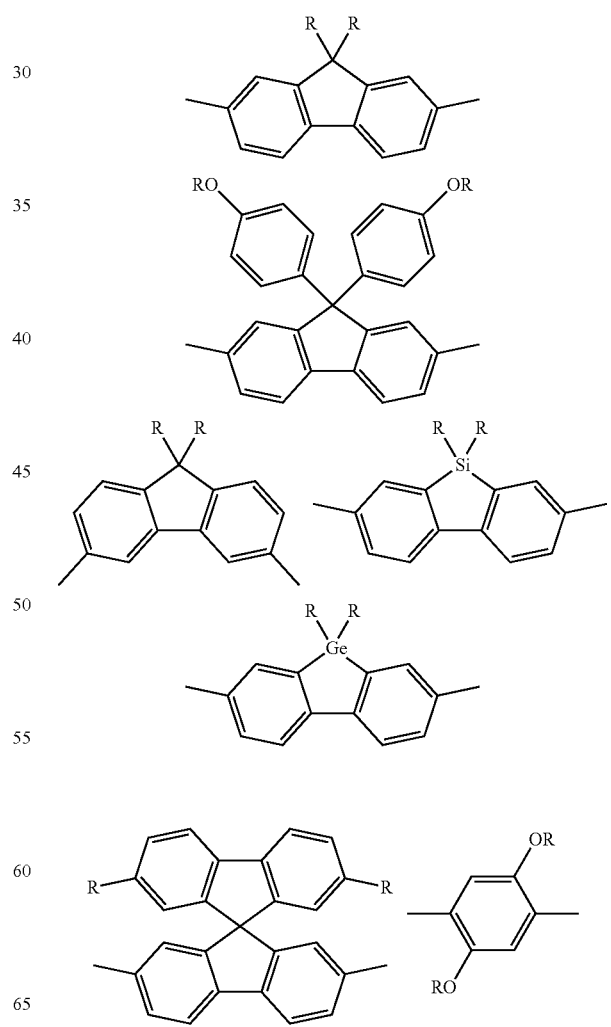

-continued

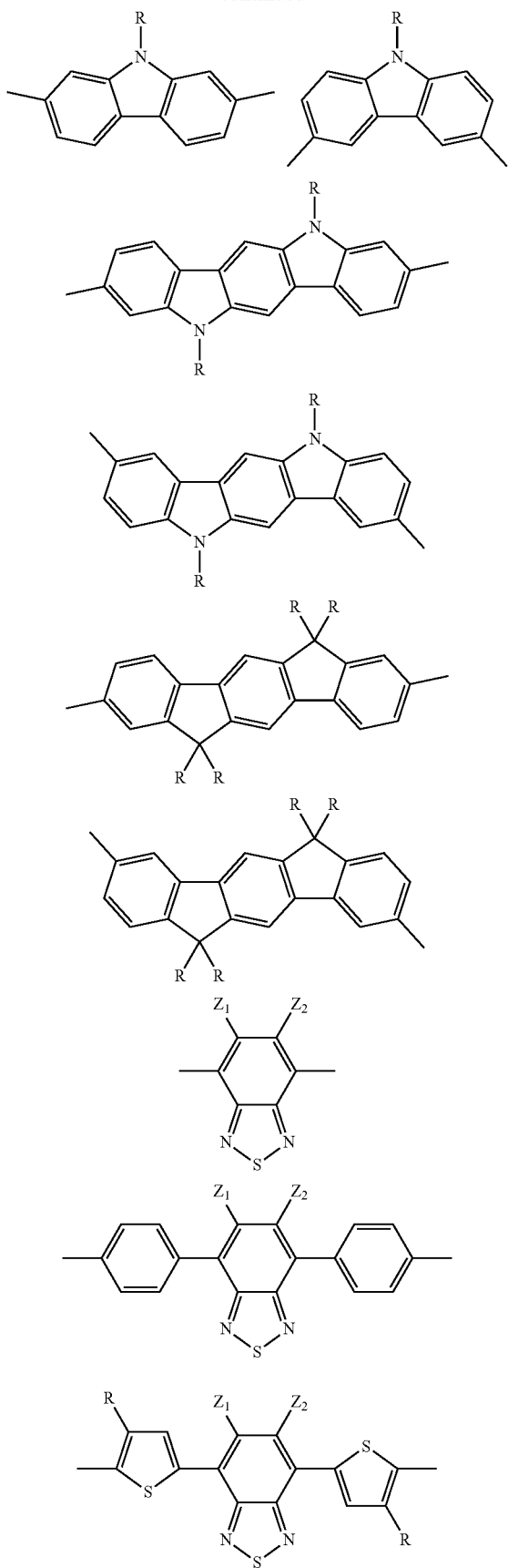

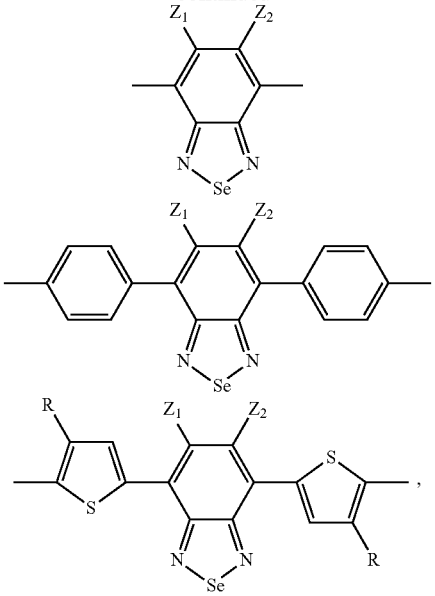

wherein, $Z_1$ and $Z_2$ are independently H, F, CN, alkenyl, alkynyl, nitrile group, amine group, nitro, acyl, alkoxy, carbonyl or sulfonyl; and R is a linear or branched alkyl or alkoxy having 1 to 30 carbon atoms or a cycloalkyl having 3 to 30 carbon atoms.

2. The polymer containing S,S-dioxide-dibenzothiophene in backbone chain with triarylamine end groups according to claim 1, wherein:

in the polymer, a molar content of the triarylamine end groups is: mol %=2/n*100%; by controlling the number of repeating units of the polymer as 10≤n≤300, the molar content mol % of the triarylamine end groups is adjusted between 0.67% and 20%.

3. A preparation method of the polymer containing S,S-dioxide-dibenzothiophene in backbone chain with triarylamine end groups according to claim 1, comprising the following steps of:

performing a Suzuki polymerization reaction to dibrominated S,S-dioxide-dibenzothiophene, a bisboronic acid ester of $Ar_2$ and a dibromide of $Ar_2$, and then performing terminating reactions with a bisboronic acid ester monomer of $Ar_2$ and a monobrominated $Ar_1$ monomer successively to obtain the polymer containing S,S-dioxide-dibenzothiophene in backbone chain with triarylamine end groups.

4. The preparation method of the polymer containing S,S-dioxide-dibenzothiophene in backbone chain with triarylamine end groups according to claim 3, wherein amounts of the dibrominated S,S-dioxide-dibenzothiophene, the bisboronic acid ester of $Ar_2$, and the dibromofluorene of $Ar_2$ satisfy that: a total mole number of the bisboronic acid ester monomers is equal to a total mole number of the dibrominated monomers.

5. The preparation method of the polymer containing S,S-dioxide-dibenzothiophene in backbone chain with triarylamine end groups according to claim 3, wherein the Suzuki polymerization reaction lasts for 0.5 hour to 16 hours at a temperature of 50° C. to 80° C.

6. The preparation method of the polymer containing S,S-dioxide-dibenzothiophene in backbone chain with triarylamine end groups according to claim 3, wherein in the terminating reactions, the terminating reactions for the bis-boronic acid ester monomer of $Ar_2$ and the monobrominated $Ar_1$ monomer both last for 1 hour to 24 hours at a temperature of 60° C. to 90° C.

7. The preparation method of the polymer containing S,S-dioxide-dibenzothiophene in backbone chain with triarylamine end groups according to claim 3, wherein a catalytic system of the Suzuki polymerization reaction and the terminating reactions comprises a palladium catalyst and a phosphine ligand; the palladium catalyst comprises palladium acetate or tris(dibenzylideneacetone)dipalladium; and the phosphine ligand comprises tricyclohexylphosphine or tri-tert-butylphosphine.

8. A method of the polymer containing S,S-dioxide-dibenzothiophene in backbone chain with triarylamine end groups according to claim 1 in preparing a light emitting layer of a light emitting diode, wherein the polymer containing S,S-dioxide-dibenzothiophene in backbone chain with triarylamine end groups is dissolved in an organic solvent, then an organic solution obtained is spin-coated, ink-jet printed, or printed to form a film, thus obtaining the light emitting layer of the light emitting diode; and the organic solvent comprises toluene, chloroform or tetrahydrofuran.

* * * * *